United States Patent

Heberle et al.

(10) Patent No.: US 9,442,169 B2
(45) Date of Patent: Sep. 13, 2016

(54) MEASURING SYSTEM

(71) Applicant: Micronas GmbH, Freiburg (DE)

(72) Inventors: Klaus Heberle, Emmendingen (DE); Joerg Franke, Freiburg (DE); Oliver Breitwieser, Gundelfingen (DE); Timo Kaufmann, Waldkirch-Suggental (DE)

(73) Assignee: Micronas GmbH, Freiburg (DE)

( * ) Notice: Subject to any disclaimer, the term of this patent is extended or adjusted under 35 U.S.C. 154(b) by 119 days.

(21) Appl. No.: 14/272,945

(22) Filed: May 8, 2014

(65) Prior Publication Data

US 2014/0333299 A1 Nov. 13, 2014

(30) Foreign Application Priority Data

May 8, 2013 (DE) .................. 10 2013 007 901

(51) Int. Cl.
*G01B 7/30* (2006.01)
*G01R 33/00* (2006.01)
*G01R 33/038* (2006.01)

(52) U.S. Cl.
CPC ......... *G01R 33/0011* (2013.01); *G01R 33/038* (2013.01)

(58) Field of Classification Search
CPC ........................................... G01B 7/30
USPC ...................................... 324/207.25
See application file for complete search history.

(56) References Cited

U.S. PATENT DOCUMENTS

| 5,781,005 | A | 7/1998 | Vig et al. |
| 5,963,028 | A | 10/1999 | Engel et al. |
| 6,064,198 | A * | 5/2000 | Wolf et al. ................. 324/207.2 |
| 6,265,865 | B1 | 7/2001 | Engel et al. |
| 6,278,269 | B1 | 8/2001 | Vig et al. |
| 6,922,052 | B2 | 7/2005 | Steinruecken et al. |
| 7,250,760 | B2 | 7/2007 | Ao |
| 8,680,847 | B2 | 3/2014 | Franke et al. |
| 2012/0217960 | A1 | 8/2012 | Ausserlechner |

FOREIGN PATENT DOCUMENTS

| CH | 682 349 A5 | 8/1993 |
| DE | 199 09 173 A1 | 9/2001 |
| DE | 698 27 559 T2 | 12/2005 |
| DE | 10 2012 203 001 A1 | 8/2012 |
| WO | WO 2010/060607 A2 | 6/2010 |

* cited by examiner

*Primary Examiner* — Bot Ledynh
(74) *Attorney, Agent, or Firm* — Muncy, Geissler, Olds & Lowe, P.C.

(57) ABSTRACT

A measuring system, having a magnetic device for generating a magnetic field and having a magnetic field sensor with a sensor surface for detecting a flux density of the magnetic field penetrating the sensor surface at least in a first spatial direction, whereby the magnetic field sensor is fixedly positioned relative to the magnetic device. The magnetic device can have at least one permanent magnet and a flux concentrator made of a ferromagnetic material. The permanent magnet has at least two pole surfaces and an outer surface. The flux concentrator can have a smaller dimensions than the outer surface of the permanent magnet. The flux concentrator can be positioned within the outer surface of the permanent magnet and the flux concentrator and the permanent magnet can have a magnetic force closure.

15 Claims, 2 Drawing Sheets

MEASURING SYSTEM

This nonprovisional application claims priority under 35 U.S.C. §119(a) to German Patent Application No. 10 2013 007 901.2, which was filed in Germany on May 8, 2013, and which is herein incorporated by reference.

BACKGROUND OF THE INVENTION

1. Field of the Invention

The present invention relates to a measuring system.

2. Description of the Background Art

WO 2010/060607 A2, which corresponds to U.S. Pat. No. 8,680,847, discloses an IC package with a semiconductor chip with an integrated circuit and an integrated magnetic sensor. A permanent magnet, whose magnetic flux penetrates the sensor, is spaced apart from the semiconductor chip package. If an object to be measured approaches the head end of the semiconductor chip, the magnetic flux density through the sensor changes.

U.S. 7,250,760 B2 discloses integrated magnetic Hall sensors in which a permanent magnet is disposed in the IC package. In this case, the Hall sensors are arranged in such a way to the field of the permanent magnet that a Hall voltage is generated without an external field effect.

DE 698 27 559 T2, which corresponds to U.S. Pat. Nos. 5,693,028 and 6,265,865, discloses a package for a magnetic field sensor. Typically, an air gap is defined as the distance between an exciter and the outer surface of the package, which contains a sensing element of the magnetic field sensor. An "effective air gap" can be described as the distance between the exciter and the sensing element itself. Magnetic field sensors typically contain a permanent magnet and a sensing element, which is encapsulated in a package. This package type, however, is not suitable for harsh environments, particularly those in an automobile. Therefore, sensing elements packaged in such a way are enclosed further in an additional package (overmold), which provides protection from moisture and dirt. This results in a decrease in the peak magnetic field strength, as a tooth passes through the magnetic field in proximity to the sensor element. It is desirable in DE 698 27 559 T2 to have the sensor element as close as possible to the magnet, because the magnetic field decreases as a function of the air gap. A smaller distance allows the use of a small magnet with a lower energy product.

DE 10 2012 203 001 A1, which corresponds to U.S. 2012/0217960, discloses a 3-D magnetic sensor. The magnetic field sensor has a flat soft-magnetic body, which is arranged on a surface of a substrate, which has a magnetic sensor array having a plurality of spatially diverse magnetic sensor elements, disposed in a predetermined configuration. In the presence of an external magnetic field, the flat soft-magnetic body is magnetized to generate a reactionary magnetic field. The plurality of magnetic sensor elements are each configured to measure a magnetic field value of a superposition of the external magnetic field and of the reactionary magnetic field along a first axis (e.g., a z-axis), which results in a plurality of spatially diverse measurements of the magnetic field component along the first axis. The plurality of spatially diverse measurements can be used to compute magnetic field components of the external magnetic field along a plurality of axes (e.g., x-axis, y-axis, and z-axis).

SUMMARY OF THE INVENTION

It is therefore an object of the invention to improve a measuring system for measuring a magnetic field.

Accordingly, in an embodiment, a measuring system is provided having a magnetic device for generating a magnetic field and having a magnetic field sensor. The magnetic field sensor is designed to detect a flux density of the magnetic field at least in a first spatial direction, whereby the magnetic field penetrates a sensor surface of the magnetic field sensor. The magnetic field sensor is fixedly positioned relative to the magnetic device.

The magnetic device has at least one permanent magnet and a flux concentrator made of a ferromagnetic material.

The permanent magnet has at least two pole surfaces and an outer surface.

The flux concentrator has smaller dimensions than the outer surface of the permanent magnet.

The flux concentrator is positioned within the outer surface of the permanent magnet.

The flux concentrator and the permanent magnet have a magnetic force closure.

Tests by the applicant have shown that it is possible to modify the magnetic field of a magnet, so that, in comparison with an original state without modification, it has a magnetic flux density component clearly reduced at specific points within space for magnetic field sensors. This flux density component occurs as an offset in the output signal of the magnetic field sensor. The reduction of this offset therefore increases the signal-to-offset ratio. The reduction of the magnetic flux density component is achieved in the present case by the flux concentrator.

The outer surface on which the flux concentrator is arranged can be formed orthogonal to the two pole surfaces.

According to an embodiment, it is provided that the flux concentrator is positioned spaced apart from the pole surfaces of the magnet poles.

According to an embodiment, the flux concentrator is positioned centered within the outer surface of the permanent magnet.

According to an embodiment, it is provided that the outer surface of the permanent magnet faces the magnetic field sensor.

According to an embodiment, it is provided that the flux concentrator is positioned toward the magnetic field sensor for deflecting the magnetic field in the area of the magnetic field sensor.

According to an embodiment, the flux concentrator can be positioned toward the sensor surface in the first spatial direction at a first distance.

According to an embodiment, the flux concentrator can have a planar shape.

According to an embodiment, a surface of the flux concentrator can be positioned parallel to the sensor surface.

According to an advantageous refinement, the flux concentrator is arranged offset to the sensor surface in a direction orthogonal to the first spatial direction.

According to an embodiment, the measuring system can have an encoder for changing a flux density in the first spatial direction through the sensor surface of the magnetic field sensor. Preferably, the encoder is, designed to change the flux density in the first spatial direction depending on the movement of the encoder, especially a rotation of the encoder.

According to an embodiment, it is provided that the magnetic device and the magnetic field sensor can be integrated in a component package. The component package is designed to be mounted on a circuit substrate.

The previously described refinement variants are especially advantageous both individually and in combination. In this regard, all refinement variants can be combined with one another. Some possible combinations are explained in the description of the exemplary embodiments shown in the figures. These possible combinations of the refinement variants, depicted therein, are not definitive, however.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
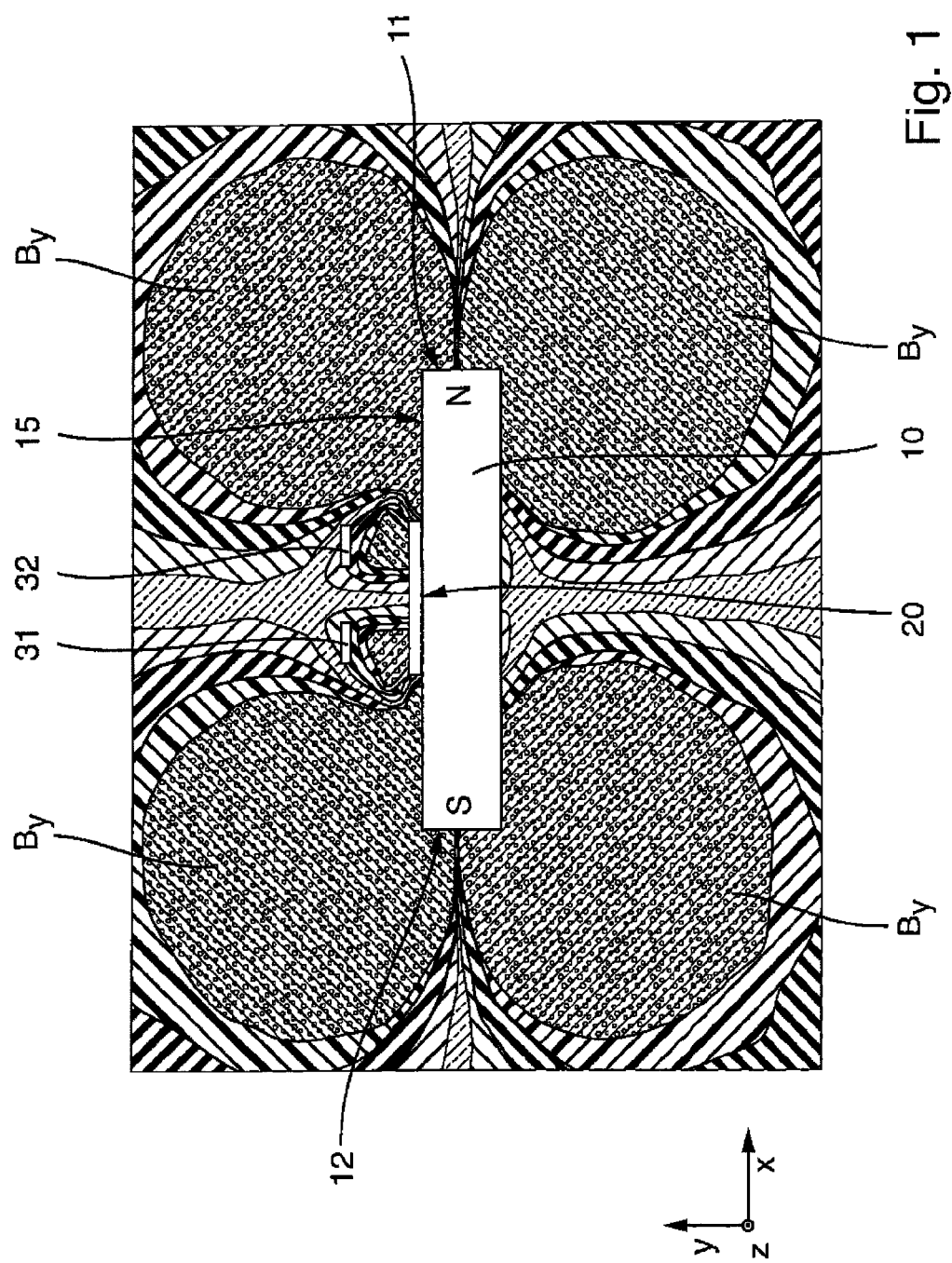
FIG. 1 shows a schematic sectional view of a measuring system with a magnetic device and magnetic field sensors.

A schematic sectional view through a measuring system is shown in FIG. 1. The measuring system has a magnetic device with a permanent magnet 10 and a flux concentrator 20 made of a ferromagnetic material for generating a magnetic field and two magnetic field sensors 31, 32 for measuring the magnetic field. Magnetic field sensors 31, 32 are fixedly positioned relative to the magnetic device, for example, by plastic by means of a form closure. In this regard, sensor surfaces A of magnetic field sensors 31, 32 are positioned toward the magnetic field.

In addition, a coordinate system with the spatial directions x, y, and z is shown in FIG. 1. Furthermore, the y-component By of the magnetic flux in the spatial direction y is shown in FIG. 1. The illustration of the y-component By in FIG. 1 is determined here by means of FEM simulation. FIG. 1 here shows the y-component By in the case that no encoder made of a ferromagnetic material influences the magnetic field. The aim of the exemplary embodiment of FIG. 1 is to achieve the smallest possible value of the y-component By of the magnetic flux in the spatial direction y in the area of each magnetic field sensor 31, 32 without an encoder and with an encoder to reach a clearly higher value of the y-component By of the magnetic flux in the spatial direction y in the area of each magnetic field sensor 31, 32.

Magnetic field sensors 31, 32 with the particular sensor surface A detect a flux density By of the magnetic field, penetrating sensor surface A, in the spatial direction y. The magnetic field in this case is defined both by the position of pole surfaces 11, 12 of magnet poles N, S of permanent magnet 10 and by the position of flux concentrator 20. Permanent magnet 10 on its front surfaces has two main poles N, S for generating the magnetic field. Permanent magnet 10 is magnetized in the x-direction. Permanent magnet 10 has an outer surface 15 in addition to the two pole surfaces 11, 12. In the exemplary embodiment of FIG. 1, outer surface 15 is orthogonal to the two pole surfaces 11, 12. The permanent magnet may have a plurality of outer surfaces or a single outer surface in a cylindrical shape.

Flux concentrator 20 has smaller dimensions than outer surface 15 of permanent magnet 10. Flux concentrator 20 is positioned within outer surface 15 of permanent magnet 10. In addition, flux concentrator 20 is arranged centered within outer surface 15. This type of centering is also shown schematically in a three-dimensional view in FIG. 2. In the exemplary embodiment of FIG. 2, flux concentrator 20 has a planar shape. A main surface 25 of flux concentrator 20 in this case is arranged parallel to outer surface 15 of permanent magnet 10. In the exemplary embodiments of FIGS. 1 and 2, flux concentrator 20 and permanent magnet 10 have at least one magnetic force closure. In addition, a form closure and/or material connection can also be provided.

It is shown in the exemplary embodiment of FIG. 1 that in the spatial direction y in the area of magnetic field sensors 31, 32 the y-component By of the magnetic flux density is especially low in the absence of an encoder because of flux concentrator 20. The flux density By is therefore significantly reduced compared with a magnetic device without flux concentrator 20. In magnetic field sensors 31, 32 in the spatial direction y, the flux density By is therefore significantly reduced by the deflection of the magnetic field by means of flux concentrator 20 compared with a magnetic device without said flux concentrator. The signal-to-offset ratio is significantly improved. Tests by the applicant have shown that the signal-to-offset ratio can be improved fivefold by means of flux concentrator 20.

Basically, a single magnetic field sensor 31, 32 is sufficient for detecting the flux density By of the magnetic field in the spatial direction y. In the exemplary embodiment of FIG. 1, two magnetic field sensors 31, 32 are provided, which are operated differentially. Both magnetic field sensors 31, 32 detect the y-component By of the magnetic flux density, whereby the y-component By in both magnetic field sensors 31, 32 has a different sign.

Figure 3:
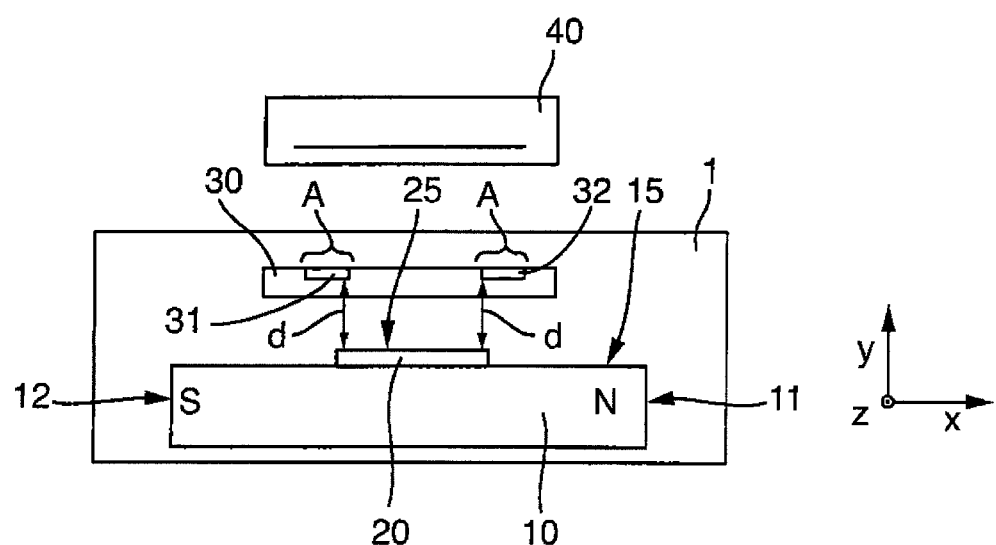
FIG. 3 shows a schematic sectional view of a measuring system with a magnetic device and magnetic field sensors and an encoder.

An exemplary embodiment with a magnetic device with a permanent magnet 10 and a flux concentrator 20 is shown schematically in a sectional view in FIG. 3. Also shown is an encoder 40 for deflecting magnetic field lines of the magnetic device, whereby the deflection causes a change in the flux density By in magnetic field sensors 31, 32.

It is shown in the exemplary embodiment of FIG. 3 that magnetic device 10, 20 and magnetic field sensors 31, 32 are integrated in a component package 1. Component package 1 is designed for mounting on a circuit substrate, for example, a circuit board (not shown). For example, magnetic device 10, 20 and a semiconductor chip 30, having magnetic field sensors 31, 32, are integrated, for example, with an integrated circuit, in a plastic package 1. Magnetic sensors 31, 32 in this case are spaced apart from flux concentrator 20 by the distance d. In contrast, in the exemplary embodiment of FIG. 3 flux concentrator 20 is arranged in outer surface 15 directly adjacent to the surface of permanent magnet 10.

Figure 2:
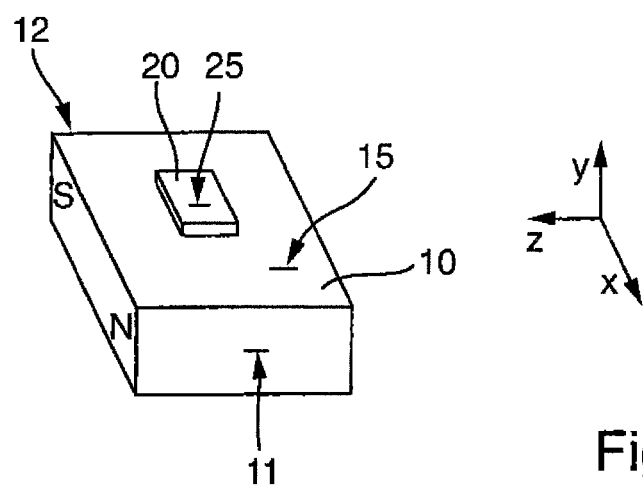
FIG. 2 is a schematic three-dimensional view of a magnetic device of a measuring system.

The invention is not limited to the shown embodiment variants in FIGS. 1 through 3. For example, it is possible to design the flux concentrator as comprising many parts or with a different shape.

Likewise, departing from the exemplary embodiments of FIGS. 1 to 3, it is possible to arrange the flux concentrator within a recess in the permanent magnet. The functionality of the measuring system according to FIG. 3 can be used especially advantageously for rotation measurement by means of a rotating encoder.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A measuring system comprising:
   a magnetic device for generating a magnetic field; and
   a magnetic field sensor with a sensor surface for detecting a flux density of the magnetic field penetrating the sensor surface at least in a first spatial direction, the magnetic field sensor being fixedly positioned relative to the magnetic device,
   wherein the magnetic device has at least one permanent magnet including two magnetic poles and a flux concentrator made of a ferromagnetic material,
   wherein the permanent magnet has at least two pole surfaces and a first elongated surface facing the magnetic field sensor,
   wherein a first length of the flux concentrator along an elongation direction parallel to the first elongated surface of the permanent magnet is shorter than a second length of the first elongated surface of the permanent magnet,
   wherein the flux concentrator is positioned on the first elongated surface of the permanent magnet, and
   wherein the flux concentrator and the permanent magnet have a closed-loop magnetic force.

2. The measuring system according to claim 1, wherein the flux concentrator is positioned spaced apart from the pole surfaces of the magnetic poles.

3. The measuring system according to claim 1, wherein the flux concentrator is positioned centered between two ends of the first elongated surface of the permanent magnet.

4. The measuring system according to claim 1, wherein the flux concentrator is positioned between the magnetic field sensor and the permanent magnet for deflecting the magnetic field in an area of the magnetic field sensor.

5. The measuring system according to claim 1, wherein the flux concentrator is separated from the sensor surface in the first spatial direction by a first distance.

6. The measuring system according to claim 1, wherein the flux concentrator has a planar shape.

7. The measuring system according to claim 1, wherein a surface of the flux concentrator along the elongation direction is positioned parallel to the sensor surface.

8. The measuring system according to claim 1, wherein the flux concentrator is arranged offset to the sensor surface in a direction orthogonal to the first spatial direction.

9. The measuring system according to claim 1, further comprising an encoder for changing the flux density in the first spatial direction through the sensor surface of the magnetic field sensor.

10. The measuring system according to claim 1, wherein the magnetic field sensor includes two sensor elements disposed in a sensor plane perpendicular to the first spatial direction and arranged at opposite ends of the flux concentrator.

11. The measuring system according to claim 1, wherein the magnetic field sensor is disposed between the flux concentrator and an encoder, the magnetic field sensor detecting changes in the flux density due to the encoder.

12. The measuring system according to claim 1, wherein the magnetic field sensor is centered between the pole surfaces and spaced apart from the first elongated surface of the permanent magnet.

13. The measuring system according to claim 12, wherein the first elongated surface is perpendicular to the at least two pole surfaces.

14. The measuring system according to claim 1, wherein the magnetic field sensor is a semiconductor sensor.

15. The measuring system according to claim 1, wherein the flux concentrator is disposed directly on the first elongated surface of the permanent magnet.

* * * * *